United States Patent
Maruyama et al.

(10) Patent No.: US 6,822,907 B2
(45) Date of Patent: Nov. 23, 2004

(54) NONVOLATILE SEMICONDUCTOR MEMORY DEVICE AND DATA READOUT METHOD FOR THE SAME

(75) Inventors: Takafumi Maruyama, Osaka (JP); Makoto Kojima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/366,403

(22) Filed: Feb. 14, 2003

(65) Prior Publication Data

US 2003/0156478 A1 Aug. 21, 2003

(30) Foreign Application Priority Data

Feb. 15, 2002 (JP) ........................................ 2002-038346

(51) Int. Cl.[7] .............................................. G11C 16/06
(52) U.S. Cl. ............................ 365/185.21; 365/185.25; 365/205; 365/210
(58) Field of Search ...................... 365/185.21, 185.23, 365/185.25, 189.07, 189.09, 189.11, 203, 205, 210, 202

(56) References Cited

U.S. PATENT DOCUMENTS

| | | | |
|---|---|---|---|
| 4,884,241 A | | 11/1989 | Tanaka et al. |
| 5,822,248 A | * | 10/1998 | Satori et al. ........... 365/185.21 |
| 5,936,888 A | | 8/1999 | Sugawara |
| 6,226,213 B1 | * | 5/2001 | Chih ........................ 365/210 |
| 6,246,622 B1 | * | 6/2001 | Sugibayashi ............. 365/210 |
| 6,449,201 B1 | * | 9/2002 | Kojima ..................... 365/205 |
| 6,480,410 B2 | * | 11/2002 | Kang et al. ............... 365/145 |
| 2001/0050377 A1 | * | 12/2001 | Ikehashi et al. .......... 257/200 |

FOREIGN PATENT DOCUMENTS

JP 11-191298 7/1999

* cited by examiner

Primary Examiner—Gene N. Auduong
(74) Attorney, Agent, or Firm—McDermott Will & Emery LLP

(57) ABSTRACT

In a dynamic sensing-type nonvolatile semiconductor memory device of the invention, which employs a differential sense amplifier circuit, a memory cell is connected to a bit line using a word line and a reference memory cell is connected to an anti-bit line using a reference word line, the potential difference between the bit line and the anti-bit line is amplified by a sense amplifier, and when reading the data of the memory cell, at the start of data readout the bit lines are both precharged to a predetermined potential by a precharge circuit, and during and after precharging or only after precharging is finished, an identical amount of current is supplied to the bit line and the anti-bit line by a bit line current supply circuit.

17 Claims, 9 Drawing Sheets

NONVOLATILE SEMICONDUCTOR MEMORY DEVICE AND DATA READOUT METHOD FOR THE SAME

BACKGROUND OF THE INVENTION

The present invention relates to nonvolatile semiconductor device memory devices and data readout methods for the same, and more particularly to techniques used in flash memories or the like provided with a differential-type sense amplifier circuit.

Recently, dynamic sensing employed in DRAMs, for example, has been proposed for nonvolatile semiconductor memory devices requiring high-speed operability. Dynamic sensing is a method for reading data by directly comparing and amplifying the information of a memory cell connected to a bit line and the information of a reference cell connected to a reference bit line using a sense amplifier circuit. Dynamic sensing allows anti-noise characteristics to be increased through the combination of a folded bit line architecture and a differential sense amplifier circuit, and is considered particularly useful for circuits requiring high-speed operability. Also, not only does dynamic sensing allow high-speed operability, but a high-sensitivity data readout operation can also be anticipated because dynamic sensing can be used to directly determine the state of a memory cell.

However, with dynamic sensing in which a differential sense amplifier circuit is used, an examination of the conventional technology has shown that when the activation timing of the sense amplifier circuit is delayed in order to increase the accuracy of the determination level when data are read from the memory cell, the charge of the bit line set to the precharge potential is discharged by the cell current of the memory cell and the cell current of the reference cell, and this makes accurate data readout difficult. This problem is examined below with reference to FIG. 8.

FIG. 8 shows the change in the potential of the bit line and the reference bit line when data are read by dynamic sensing using a conventional nonvolatile semiconductor memory device. In a preferable design, at the sense activation timing SENSE TIMING@Read of an ordinary readout operation, the reference potential Reference that is generated by the reference cell is a potential precisely in the middle between the potential Memcell@Prog on the write side of the memory cell and the potential Memcell@Erase on the erase side of the memory cell. However, if dynamic sensing is used in a verification operation for determining whether the memory cells of nonvolatile semiconductor memory devices, namely flash EEPROMs or the like, have been erased or written to a desired state, then when the activation timing of the sense amplifier circuit is slowed down to the readout timing SENSE TIMING@Verify for verification in order to increase the determination accuracy, the potential of the bit line is significantly lowered by the cell current of the memory cell and the cell current of the reference cell and flattens out, and thus readout determination at the desired timing is precluded.

To keep the bit line voltage from flattening out at the time of the readout operation, in the prior art a proposal has been set forth in JP H11-191298A for a method with which, as schematically shown in FIG. 9A, the potential of the reference bit line MBL0 is held constant at the precharge potential, and a ½ current supply circuit d is provided for supplying a current of roughly half the value of the current flowing to the memory cell c to the bit line MBL1, to which data from the memory cell c have been read, in a direction that cancels out the current of the memory cell c, either during and after precharging or only after precharging.

However, with this conventional configuration, when the ½ current supply circuit d is affected by noise such as fluctuations in the power source, the amount of current that it supplies to the bit line MBL1 is changed, leading to a reduction in the operation margin at the desired activation timing of the sense amplifier circuit SAMP. To compensate for the operation margin it becomes necessary to delay the activation timing of the sense amplifier circuit SAMP, and as a result the high-speed data readout operation is compromised.

FIG. 9B shows the potential change in the bit line MBL1 and the reference bit line MBL0 during conventional data readout. Even if the power source voltage VSA of the ½ current supply circuit d of FIG. 9A is a stabilized power source that is not dependant on an outside voltage and is generated within the device, if a control signal HPC0 for controlling the gate voltage of the p-channel transistor making up the ½ current supply circuit d is affected by power source fluctuations or coupling noise between adjacent signal wires during the data readout operation and thereby fluctuated, then the current supplied from the ½ current supply circuit d is changed at this time. For example, when an actually supplied supply current Ia is small enough that Ia<½×Imem, where ½×Imem is approximately half the value of the current Imem that is actually supplied to the memory cell c, then as shown by the short dashed lines and the long-short dashed lines in FIG. 9B, the difference in potential with respect to the reference voltage Reference is increased at the erase potential Memcell@Erase of the memory cell c, whereas the potential difference is reduced at the write potential Memcell@Prog of the memory cell c. On the other hand, when the supplied current is large enough that Ia>½×Imem, then the converse is true, and at the erase potential Memcell@Erase of the memory cell c there is a small potential difference with respect to the reference voltage Reference whereas at the write potential Memcell@Prog of the memory cell c there is a large potential difference. For this reason, the characteristics of the potential change at the memory cell c are unstable even if the reference potential is held constant and stabilized at the precharge potential, and thus extra time is required before a desired potential difference that is readable by the differential sense amplifier circuit SAMP is reached, which hinders high-speed readout. Also, when the amount of supplied current fluctuates during the verification operation, in which an infinitesimal current difference is determined by the differential sense amplifier circuit SAMP, or during measurement of the current of the memory cell c, for example, the amount of current that cancels out the cell current of the memory cell c itself is varied, and thus accurate results are difficult to obtain.

SUMMARY OF THE INVENTION

It is an object of the invention to provide a nonvolatile semiconductor memory device and a data readout method for the same, with which an accurate and high-speed data readout operation and a high-precision data readout operation are possible.

To achieve the above object, the configuration of the present invention allows an identical amount of current to be supplied to bit line to which memory cell is connected and to bit line to which reference cell is connected when data is read from memory cell.

More specifically, a nonvolatile semiconductor memory device of the invention is characterized in that it is provided with a word line connected to a control gate of a memory cell in a row direction, a first bit line connected to a drain side of a memory cell in a column direction, a reference word line connected to a gate of a reference cell in the row direction, a second bit line connected to a drain side of a reference cell, an amplifier for amplifying a potential difference between the first bit line and the second bit line, a precharge circuit for precharging the first and the second bit lines to a predetermined potential at the start of data readout, and a bit line current supply circuit for supplying a same current amount to the first and the second bit lines during the data readout.

Another nonvolatile semiconductor memory device of the invention is characterized in that it is provided with a memory array including a plurality of memory cells and reference cells, a plurality of word lines each connected to a control gate of a memory cell, from among the plurality of memory cells, in a row direction, a plurality of sub-bit lines each connected to a drain side of memory cells, from among the plurality of memory cells, and a reference cell, form among the reference cells, in a column direction, a first main bit line connected to one of the plurality of sub-bit lines, a second main bit line connected to another one of the plurality of sub-bit lines, an amplifier for amplifying a potential difference between the first main bit line and the second main bit line, a precharge circuit for precharging the first and the second main bit lines to a predetermined potential at the start of data readout, and a bit line current supply circuit for supplying a same current amount to the first and the second main bit lines during the data readout.

The invention is characterized in that in the nonvolatile semiconductor memory device, the reference cells are connected to reference cell word lines that are different from the word lines connected to the memory cells.

The invention is characterized in the nonvolatile semiconductor memory device further includes an activation timing generation circuit for adjusting an activation timing of the amplifier.

The invention is characterized in that in the nonvolatile semiconductor memory device, a power source for supplying a power source voltage to the precharge circuit and the bit line current supply circuit is a stabilized power source that is arranged inside the nonvolatile semiconductor memory device, and the stabilized power source generates a power source voltage that is not dependant on an outside voltage.

The invention is characterized in that in the nonvolatile semiconductor memory device, the bit line current supply circuit is controlled by a control signal line for controlling the current that is supplied to the first bit line or the first main bit line and the current that is supplied to the second bit line or the second main bit line.

The invention is characterized in that in the nonvolatile semiconductor memory device, the bit line current supply circuit has a configuration with which the amount of supplied current is changed to correspond to an operation mode of the nonvolatile semiconductor memory device.

The invention is characterized in that in the nonvolatile semiconductor memory device, the bit line current supply circuit supplies a current amount that is substantially equal to the amount of current that is flowed through the reference cells.

The invention is characterized in that in the nonvolatile semiconductor memory device, the control signal line of the bit line current supply circuit is shielded by a power source line or a grand line of the stabilized power source.

The invention is characterized in that in the nonvolatile semiconductor memory device, the bit line current supply circuit is made of a plurality of bit line current supply circuit each separately provided for an operation mode.

The invention is characterized in that in the nonvolatile semiconductor memory device, an arrangement architecture of the first bit line and the second bit line is a folded bit line architecture in which the bit lines run parallel to one another, and the bit line current supply circuit is disposed at a location that is removed from the amplifier.

The invention is characterized in that in the nonvolatile semiconductor memory device, an arrangement architecture of the first bit line and the second bit line is an open bit line architecture in which the bit lines run perpendicular to one another, and the bit line current supply circuit is disposed at a location that is near the amplifier.

A data readout method of a nonvolatile semiconductor memory device according to the invention is characterized in that the nonvolatile semiconductor memory device is provided with a word line connected to a control gate of a memory cell in a row direction, a first bit line connected to a drain side of a memory cell in a column direction, a reference word line connected to a gate of a reference cell in the row direction, a second bit line connected to a drain side of a reference cell, an amplifier for amplifying a potential difference between the first bit line and the second bit line, a precharge circuit for precharging the first and the second bit lines to a predetermined potential at the start of data readout, and a bit line current supply circuit for supplying a same current amount to the first and the second bit lines during the data readout, in which the method includes, when data is read out, the steps of selecting the memory cells by the word line to connect a memory cell of the plurality of memory cells to the first bit line; selecting the reference cells by the reference word line to connect a reference cell of the plurality of reference cells to the second bit line; and supplying a current of the same amount to both the first and the second bit lines.

The invention is characterized in that in the data readout method of a nonvolatile semiconductor memory device, during data readout, first, the first and the second bit lines are precharged to the predetermined potential by the precharge circuit, and then during and after precharging, or only after precharging, a same current amount is supplied to the first and the second bit lines.

The invention is characterized in that in the data readout method of a nonvolatile semiconductor memory device, the amount of supply current that is supplied to the first and the second bit lines during data readout is changed in correspondence with an operation mode of the nonvolatile semiconductor memory device during data readout.

The invention is characterized in that in the data readout method of a nonvolatile semiconductor memory device, an activation timing of the amplifier during data readout is changed in correspondence with the data readout precision during the data readout.

As described above, with the present invention, at the time of data readout from a selected memory cell, the same amount of current is supplied from the bit line current supply circuit to the bit line to which the selected memory cell is connected and the bit line to which the reference cell is connected while the readout of data is performed, and thus the characteristics of the potential change are the same for the memory cell and the reference cell, which allows an accurate readout operation to be achieved. Moreover, the characteristics of the potential change of the bit line on the memory cell side are the same regardless of whether the memory cell is in a written state or an erased state, and thus the activation timing of the sense amplifier circuit can be set to the same timing for both the written and the erased states and it is not necessary to set the activation timing to a delayed timing such as a case in which the timing is different for these different states. Accordingly, a high-speed readout operation is possible.

In addition, because the same amount of current is supplied to the bit line on the memory cell side and the bit line on the reference cell side and drops (flattening out) of the potential level of these bit lines can be inhibited, a high-precision readout operation can be achieved. Also, for example, even if the amount of current that is supplied to the bit lines is changed by power source noise, for example, the impact of the change in the amount of current that is supplied to the two bit lines is equally reflected in both bit lines, and thus there is substantially no effect to the differential readout operation, allowing a readout operation that is strong against noise to be achieved.

In particular, if the amount of current that is supplied equally to the bit line on the memory cell side and the bit line on the reference cell side is changed to correspond to the operation mode, such as the verification operation, or the activation timing of the amplifier is changed to correspond to the data readout precision, then the flattening of the potential of both bit lines during the data readout operation can be suppressed over a comparatively long period, and thus even in the case of a verification operation, in which the activation timing of the sense amplifier is delayed, an infinitesimal current difference between the bit lines can be detected using dynamic sensing, which allows a high-precision readout out operation to be achieved.

DETAILED DESCRIPTION OF THE INVENTION

Hereinafter, embodiments of the nonvolatile semiconductor memory device and the readout method thereof according to the present invention are described with reference to the appended drawings.

First Embodiment

Figure 1:
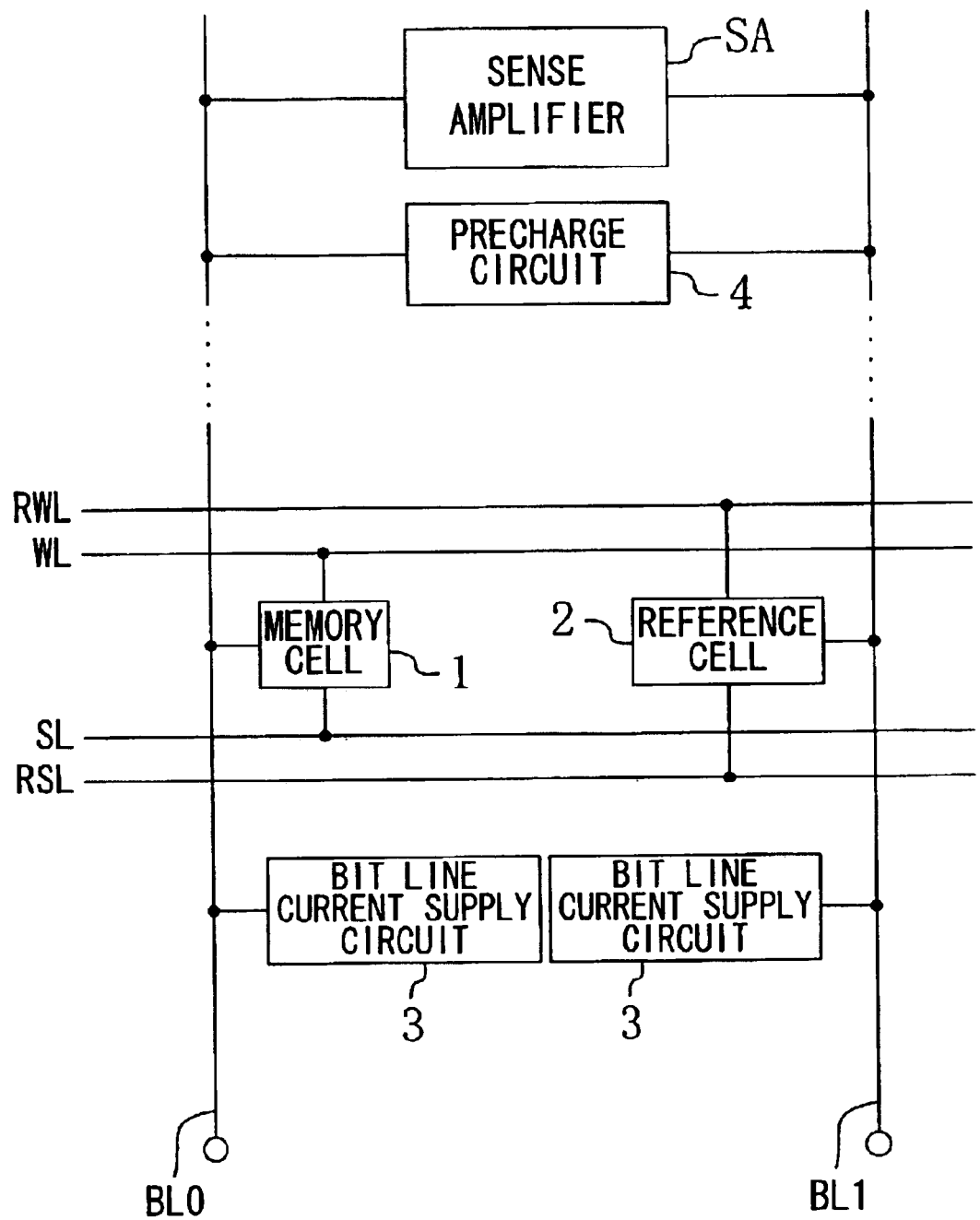
FIG. 1 is a block diagram showing the basic configuration of the nonvolatile semiconductor memory device according to the first embodiment of the invention.

FIG. 1 is a block diagram showing the basic configuration of the nonvolatile semiconductor memory device of the invention.

Figure 3:
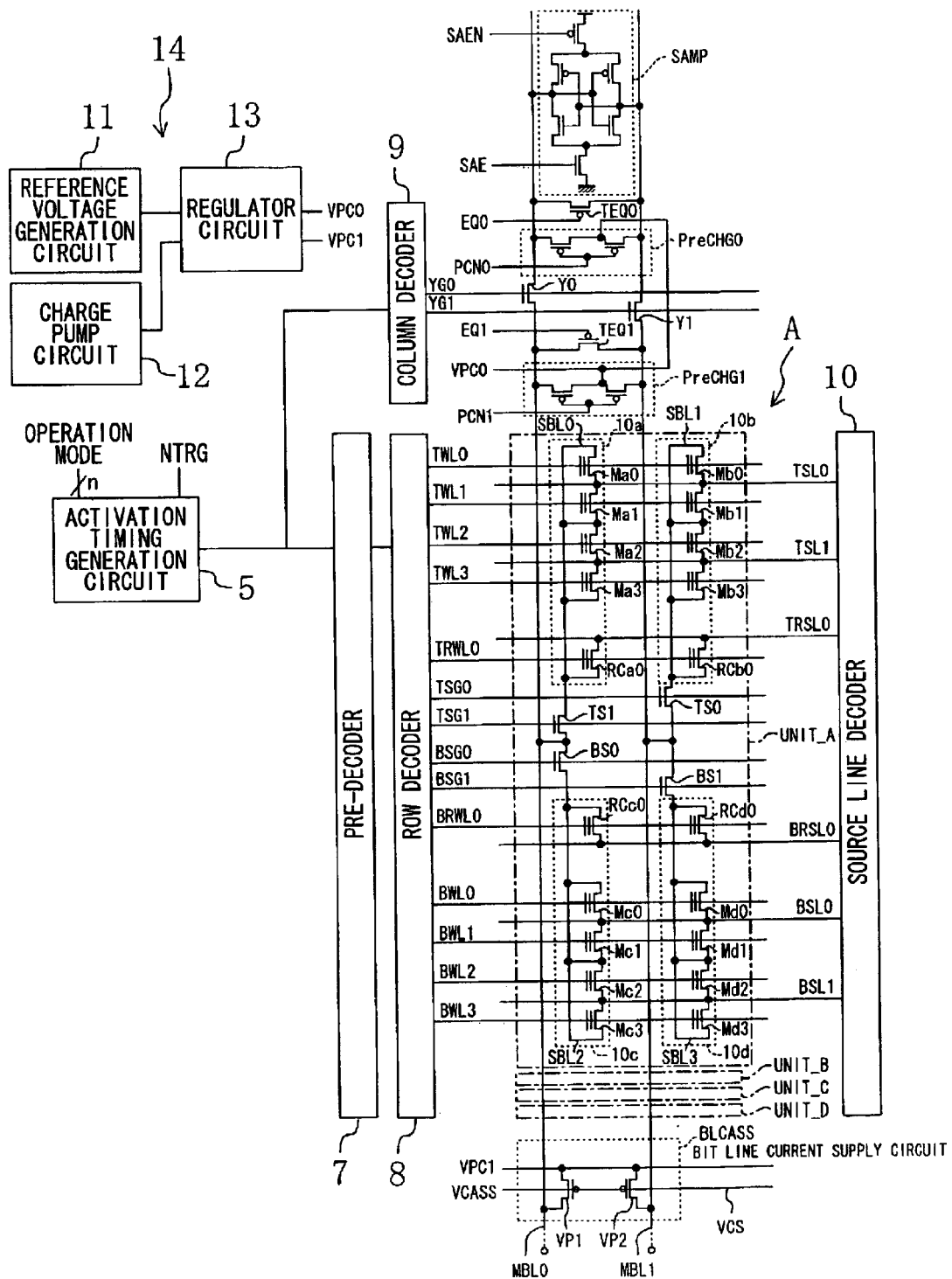
FIG. 3 is a diagram showing a detailed configuration of the nonvolatile semiconductor memory device.

In FIG. 1, the numeral 1 denotes a memory cell, which is a nonvolatile semiconductor memory element, and although only one memory cell 1 is shown, in practice there are numerous memory cells 1 arranged in the row and column directions. The numeral 2 denotes a reference cell, which is a nonvolatile semiconductor memory element, and the reference cell 2 is similarly provided in plurality in the row and column directions. WL is the word line connected to the control gates of the memory cells 1 lined up in the row direction, BL0 is a first bit line connected to the drain side of the memory cells 1 arranged in a line in the column direction, and SL is a first source line connected to the source side of the memory cells 1 connected to the first bit line BL0. In addition, RWL is a reference word line connected to the gates of the reference cells 2 arranged in a line in the row direction, BL1 is a second bit line connected to the drain side of the reference cells 2 arranged in the column direction, and RSL is a second source line connected to the source side of the reference cells 2 that are connected to the second bit line BL1. FIG. 3 provides a detailed description of the connections between the memory cells 1 and the reference cells 2 and the word lines WL and RWL and the source lines SL and RSL, respectively.

Also, SA denotes a differential sense amplifier circuit (differential amplifier) for amplifying the potential difference between the first bit line BL0 and the second bit line BL1, and the numeral 4 denotes a precharge circuit for initially precharging the first and the second bit lines BL0 and BL1 to a predetermined potential when data are read out from the memory cells 1.

Also, the numerals 3 denote two bit line current supply circuits, which are a characteristic of the invention, that are activated when data are read from the memory cells 1 and supply current. One of the bit line current supply circuits 3 supplies current to the first bit line BL0 and the other bit line current supply circuit 3 supplies current to the second bit line BL1. The bit line current supply circuits 3 supply an equal amount of current to the first and the second bit lines BL0 and BL1. It should be noted that although they have not been shown, control signal lines for controlling the differential sense amplifier circuit SA, the bit line current supply circuits 3, and the precharge circuit 4 have been provided independently.

Figure 2:
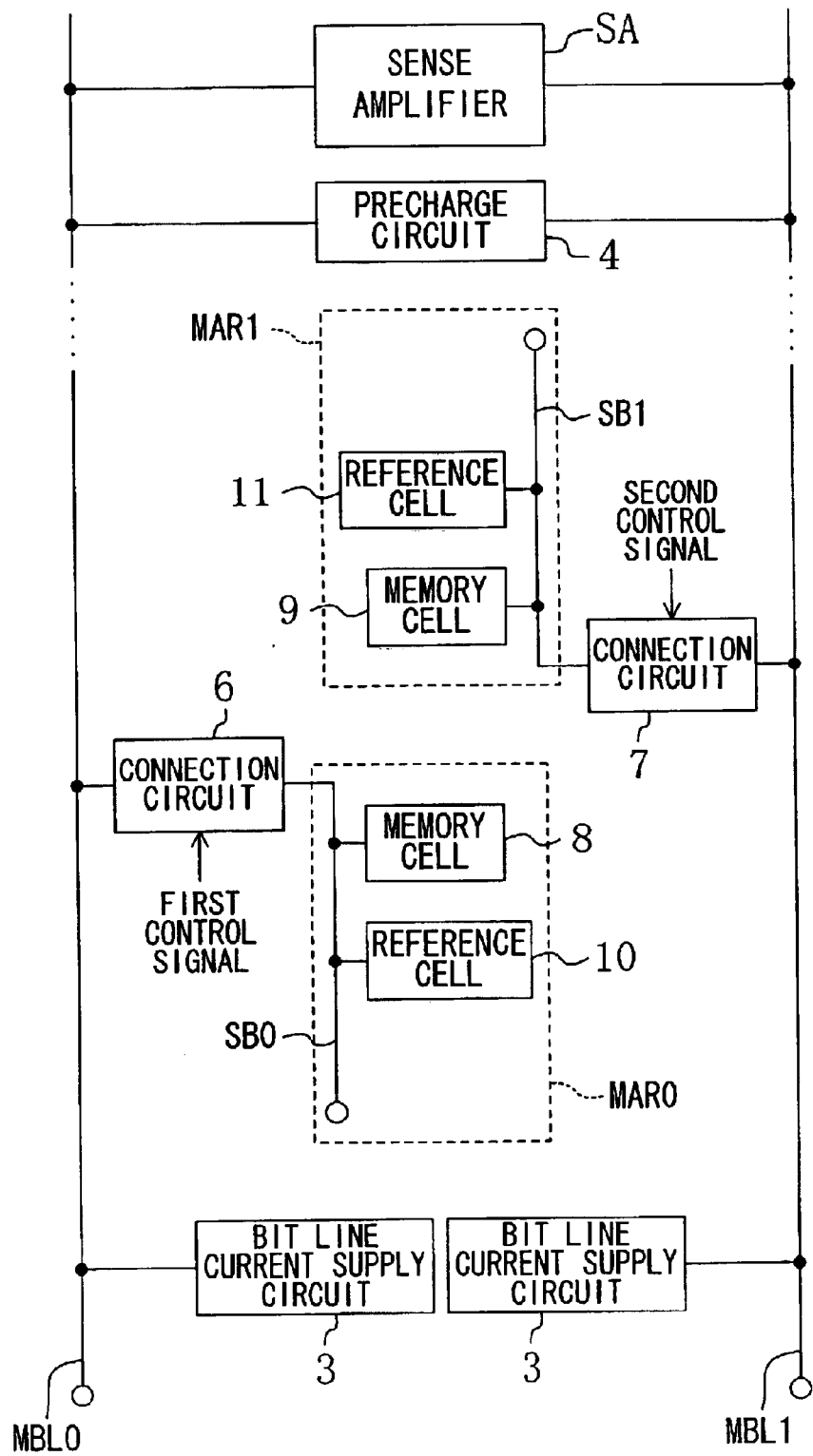
FIG. 2 is a block diagram showing a configuration in which the nonvolatile semiconductor memory device has been provided with hierarchical bit line architecture.

FIG. 2 is a block diagram in which the configuration of the nonvolatile semiconductor memory device shown in FIG. 1 has been expanded to a hierarchical bit line structure. This configuration allows high-speed readout to be achieved.

In the nonvolatile semiconductor memory device shown in FIG. 2, MAR0 and MAR1 are memory cell blocks that have been provided with memory cells 8 and 9 and reference cells 10 and 11, respectively. The memory cells 8 and 9 and the reference cells 10 and 11 in the memory blocks MAR0 and MAR1 are connected to sub-bit lines SB0 and SB1, respectively. The sub-bit lines SB0 and SB1 are connected to a main bit line MBL0 and an anti-main bit line MBL1 via connection circuits 6 and 7, respectively. The differential sense amplifier circuit SA and the precharge circuit 4 are connected to the bit line MBL0 and the anti-main bit line (complementary main bit line) MBL1. Also, the two bit line current supply circuits 3 are connected to the main bit line MBL0 and the anti-main bit line MBL1, respectively, and supply the same amount of current to the bit lines MBL0 and MBL1. It should be noted that a basic configuration of the pair of main bit lines MBL0 and MBL1 has been illustratively shown in FIG. 2, however, other main bit line pairs have the same configuration as these, and thus will not be shown or described. Also, the reference cells R10 and R11 do not necessarily have to be included in the corresponding sub-bit lines SB0 and SB1, as long as they are configured and arranged so that they have the same load as the memory cells that are read out.

FIG. 3 shows a specific configuration of the nonvolatile semiconductor memory device illustrated in FIG. 2.

In FIG. 3, four memory cell units UNIT-A to UNIT-D are arranged in the column direction and together configure a memory cell array A. These memory cell units have the same configuration. An example of the configuration of the memory cell unit UNIT-A is illustrated below. The memory cell unit UNIT-A has four memory cell blocks 10a to 10d arranged in an array, and each memory cell block 10a to 10d respectively has four memory cells Ma0 to Ma3, Mb0 to Mb3, Mc0 to Mc3, and Md0 to Md3, which are nonvolatile semiconductor memory elements arranged in the column direction, and one reference cell RCa0, RCb0, RCc0, and RCd0, respectively, which are nonvolatile semiconductor memory elements.

Here, the nonvolatile semiconductor memory elements store two information values corresponding to whether electrons are stored in their floating gate. If electrons are stored, then the threshold value of the memory cell becomes high and current substantially does not flow to the memory cell even if a certain constant gate voltage is applied. This state is regarded as a "0" having been written. When electrons have not been stored, then the threshold value of the memory cell becomes low and current is allowed to flow to the memory cell when a certain constant gate voltage is applied. This state is regarded as a "1" having been written. Here, an erased state shall be regarded as "1" and a written state shall be regarded as "0."

In the memory cell block 10a, a single sub-bit line SBL0 is connected to the drain sides of the memory cells Ma0 to Ma3 and the reference cell RCa0. Likewise, in the other memory cell blocks 10b to 10d, one sub-bit line SBL1 to SBL3 respectively arranged in the blocks is connected to the drain sides of the respective memory cells and reference cell within the blocks (Mb0 to Mb3, Rcb0) (Mc0 to Mc3, RCc0) (Md0 to Md3, RCd0).

In addition, the sub-bit lines SBL0 and SBL2 of the memory cell blocks 10a and 10c arranged in a line in the column direction are connected to the main bit line (first main bit line) MBL0 via selection gates TS1 and BS0, respectively (correspond to the connection circuit 6 in FIG. 2). Likewise, the sub-bit lines SBL1 and SBL3 of the memory cell blocks 10b and 10d arranged in a line in the column direction are connected to the anti-main bit line (second main bit line) MBL1 via selection gates TS0 and BS1, respectively (correspond to the connection circuit 7 in FIG. 2). The pair of main bit lines MBL0 and MBL1 have a folded bit line architecture in which they run parallel to one another. It should be noted that the invention is not limited to this bit line architecture, and it is also possible to use an open bit line architecture in which the main bit line MBL0 and the anti-main bit line MBL1 run perpendicular to one another. Also, it is not absolutely necessary that the reference cells RCa0 to RCd0 are included in the corresponding sub-bit lines SBL0 and SBL1, as long as they are configured and arranged so that they have the same load as the memory cells that are read out.

Also, in FIG. 3, TWL0 to TWL3 are word lines that are connected to the control gates of the memory cells (Ma0, Mb0) to (Ma3, Mb3), respectively, which are arranged in a line in the row direction between the memory cell blocks 10a and 10b. Similarly, BWL0 to BWL3 are word lines that are connected to the control gates of the memory cells (Mc0, Md0) to (Mc3, Md3), respectively, which are arranged in a line in the row direction between the memory cell blocks 10c and 10d. TRWL0 and BRWL0 are reference word lines connected to the gates of the reference cells RCa0, RCb0, RCc0, and RCd0. TSL0, TSL1, BSL0, and BSL1 are source lines of the memory cells Ma0 to Ma3, Mb0 to Mb3, Mc0 to Mc3, and Md0 to Md3. TRSL0 and BRSL0 are source lines of the reference cells RCa0, RCb0, RCc0, and RCd0.

The main bit line MBL0 and the anti-main bit line MBL1 are connected to the differential sense amplifier circuit SAMP via column gates Y0 and Y1, respectively. The sense amplifier circuit SAMP is made of a flip-flop type sense amplifier in which the input and the output of two CMOS inverters are cross-connected to one another. The sense amplifier circuit SAMP is controlled by two control signals SAE and SAEN, and determines and amplifies the potential difference between the main bit line MBL0 and the anti-main bit line MBL1 when the control signal SAE is H-level and the control signal SAEN is L-level.

Precharge circuits PreCHG0 and PreCHG1 and equalization transistors TEQ0 and TEQ1 are provided between the main bit line MBL0 and the anti-main bit line MBL1, respectively sandwiching the column gates Y0 and Y1 in between. The precharge circuits PreCHG0 and PreCHG1 are p-channel MOS transistors and are controlled by control signals PCN0 and PCN1. The equalization transistors TEQ0 and TEQ1 are controlled by control signals EQ0 and EQ1, and equalize the potential of the main bit line MBL0 and the potential of the anti-main bit line MBL1.

Also, as shown in FIG. 3, BLCASS is a bit line current supply circuit that supplies an identical amount of current to the main bit line MBL0 and the anti-main bit line MBL1. The bit line current supply circuit BLCASS is provided with a pair of p-channel MOS transistors serving as current supply transistors VP1 and VP2 for supplying current to the main bit line MBL0 and the anti-main bit line MBL1 based on a later-described power source voltage VPC1 that is supplied from a stabilized power source. The current supply transistors VP1 and VP2 are connected to a single control signal line VCS for supplying a control voltage VCASS to the gates of both transistors VP1 and VP2. The control signal line VCS is shielded by the power source line or the grand line (not shown) of the stabilized power source. The control signal line VCS can be made of a plurality of lines. The bit line current supply circuit BLCASS is not limited to the configuration set forth above, and may alternatively have a configuration in which another transistor(s) serving as a switch(es) is additionally provided between the current supply transistors VP1 and VP2 and the main bit line MBL0 and the anti-main bit line MBL1, for example. Such a configuration is advantageous if it takes time to establish the control voltage VCASS on the current signal line VCS. That is, when time is required to generate the control voltage VCASS each time a plurality of cycles of the readout operation are performed, then the control voltage VCASS is held constant at a predetermined voltage and the additionally provided transistor(s) allows the amount of current that is supplied to the main bit line MBL0 and the anti-main bit line MBL1 to be controlled.

A layout in which the bit line current supply circuit BLCASS is arranged at a position that is removed from the sense amplifier circuit SAMP is preferable if a folded bit line architecture is adopted as in this embodiment. The reason for this is that the bit line current supply circuit BLCASS is affected by voltage drops or the like due to the consumption current of the sense amplifier circuit SAMP if it is arranged near the sense amplifier circuit SAMP. On the other hand, if an open bit line architecture is adopted, then conversely a layout in which the bit line current supply circuit BLCASS is arranged near the sense amplifier circuit SAMP is preferable. This is because in the case of an open architecture, a large difference in the impact of noise, for example, in the operating state of the current supply transistors VP1 and VP2 occurs due to the large difference in the distance over which the control voltage VCASS is transmitted via the control signal line VCS to the gate of the current supply transistor VP1 and the distance over which it is transmitted via the control signal line VCS to the gate of the current supply transistor VP2. This problem can be offset by enhancing the power source wiring around the sense amplifier SAMP so as to reduce the effects of voltage drops or the like due to the consumption current of the sense amplifier circuit SAMP.

Furthermore, in FIG. 3, the numeral 7 denotes a pre-decoder and 8 denotes a row decoder for selecting the word lines TWL0 to BWL3 and the reference word lines TRWL0 and BRWL0. The numeral 9 denotes a column decoder for selecting and controlling the column gates Y0 and Y1. The numeral 10 denotes a source line decoder for selecting the source lines TSL0 to BSL1 and the reference source lines TRSL0 and TRSL1. The numeral 5 denotes an activation timing generation circuit for adjusting the activation timing of the pre-decoder 7, the column decoder 9, the source line decoder 10, and the sense amplifier circuit SAMP, for example. Also, the numeral 11 denotes a reference voltage generation circuit, 12 denotes a charge pump circuit for generating a stepped-up voltage, 13 is a regulator circuit for adjusting the reference voltage and the stepped-up voltage that are generated by the reference voltage generation circuit 11 and the charge pump circuit 12. The regulator circuit 13 stabilizes and supplies a voltage VPC0 (precharge voltage) for precharging the main and anti-main bit lines MBbL0 and MBL1 by the precharge circuits PreCHG0 and PreCHG1 and supplies the power source voltage VPC1 for bit line current supply to the bit line current supply circuit BLCASS. The reference voltage generation circuit 11, the charge pump circuit 12, and the regulator circuit 13 together configure a stabilized power source 14 that is arranged inside the nonvolatile semiconductor memory device.

Figure 4:
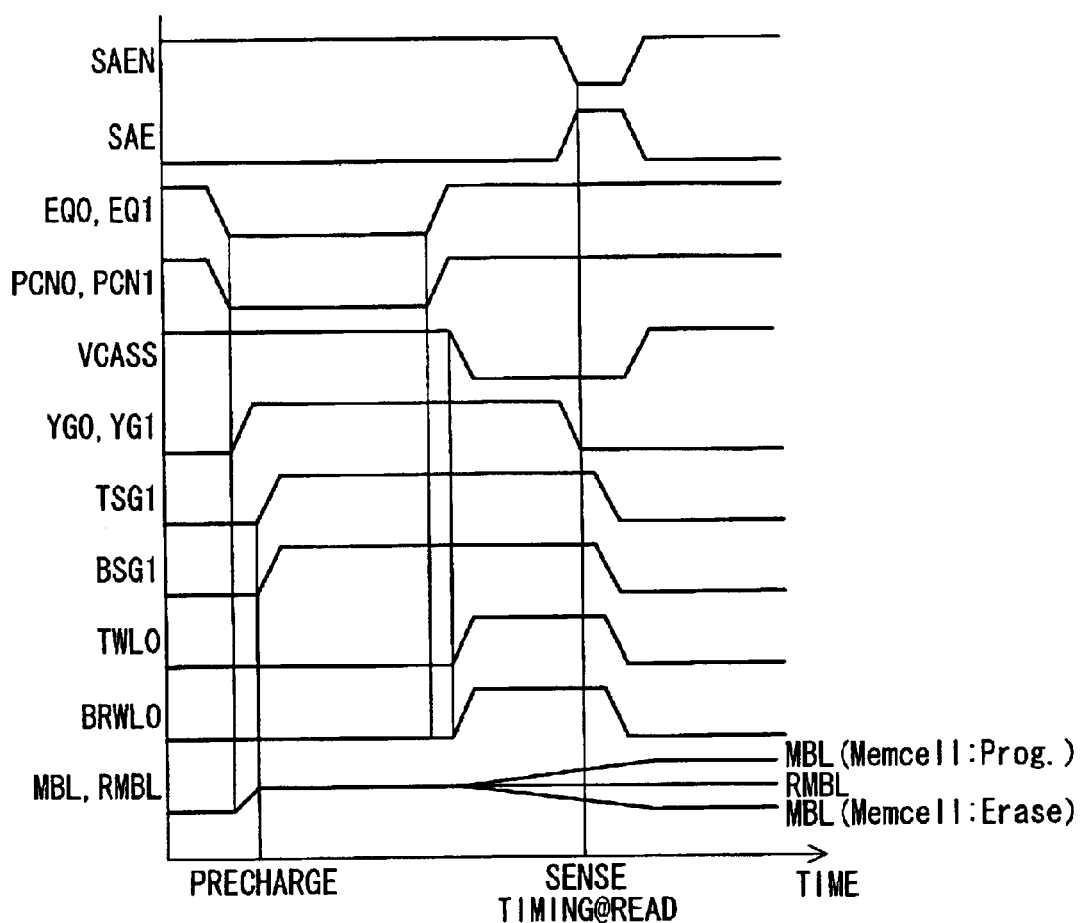
FIG. 4 is a diagram showing the operation timing of the nonvolatile semiconductor memory device.

The data readout operation of the nonvolatile semiconductor memory device configured above is described below with reference to FIG. 4.

In the case illustrated below, the memory cell Ma0 in the memory cell block 10a connected to the main bit line MBL0 is read out using the reference cell RCd0. It should be noted that in the following description the amount of current that is flowed through the reference cell RCd0 is precisely in the middle between the cell current of the memory cell Ma0 in an erased state and the cell current of the memory cell Ma0 in a written state.

As an initial state, the potentials of the sub-bit lines SBL0 to SBL3 connected to the main bit line MBL0 and the anti-main bit line MBL1 are set to the ground potential by a resetting transistor, which is not shown. Also, during the data readout operation, the source lines TSL0, TSL1, BSL0, BSL1, TRSL0, and BRSL0 are each at the ground potential.

First, with the word lines TWL0 to TWL3 and BWL0 to BWL3, the reference word lines TRWL0 and BRWL0, and the selection signal lines TSG0, TSG1, BSG0, and BSG1 at the L-level, the control signals PCN0 and PCN1 are set to the L-level to activate the precharge circuits PreCHG0 and PreCHG1 and precharge the main bit line MBL0 and the anti-main bit line MBL1 to a predetermined voltage. At this time, the column gates Y0 and Y1 are set to the H-level so that the input and output portions of the sense amplifier circuit SAMP are also precharged to the same potential as the main bit line MBL0 and the anti-main bit line MBL1. Also, the equalization signals EQ0 and EQ1 are set to the L-level and the equalization transistors TEQ0 and TEQ1 are activated so as to connect the main bit line MBL0 and the anti-main bit line MBL1 to one another and equalize their potentials. Thus, variation in the potential difference between the main bit line MBL0 and the anti-main bit line MBL1 during data readout is inhibited.

Next, the selected signal lines TSG1 and BSG1 are set to the H-level to turn on the selected transistors TS1 and BS1 and connect the sub-bit lines SBL0 and SBL3 to the main bit line MBL0 and the anti-main bit line MBL1, respectively. Then, before the selected word lines TWL0 and BRWL0 become H-level, the equalization signals EQ0 and EQ1 are returned to H-level so as to disconnect the main bit line MBL0 and the anti-main bit line MBL1. At this time, the precharge signals PCN0 and PCN1 are set to the H-level at substantially the same time.

Next, the control signal VCASS is set to a predetermined voltage level so that current of a desired value is supplied from the bit line current supply circuit BLCASS to the main bit line MBL0 and the anti-main bit line MBL1. Variation in the signal voltage level of the control signal VCASS causes the amount of current that is supplied from the bit line current supply circuit BLCASS to change, however, because the control signal VCASS is supplied from the stabilized power source 14 arranged inside the device, there is little variation in its signal voltage level and the effective amount of current that is supplied from the bit line current supply circuit BLCASS is near the desired value. Moreover, the control signal line VCS over which the control signal VCASS is transmitted is shielded by the power source wiring, for example, of the stabilized power source 14, and thus the effect of coupling noise due to coupling with adjacent wires is small and the effective amount of current that is supplied from the bit line current supply circuit BLCASS is stabilized at the desired value. Here, the amount of supplied current is regarded as substantially equivalent to the cell current of the reference cell RCd0 that is selected. It should be noted that the time at which the control signal VCASS is activated can also be during the precharge operation, when the precharge signals PCN0 and PCN1 are still L-level.

Figure 5:
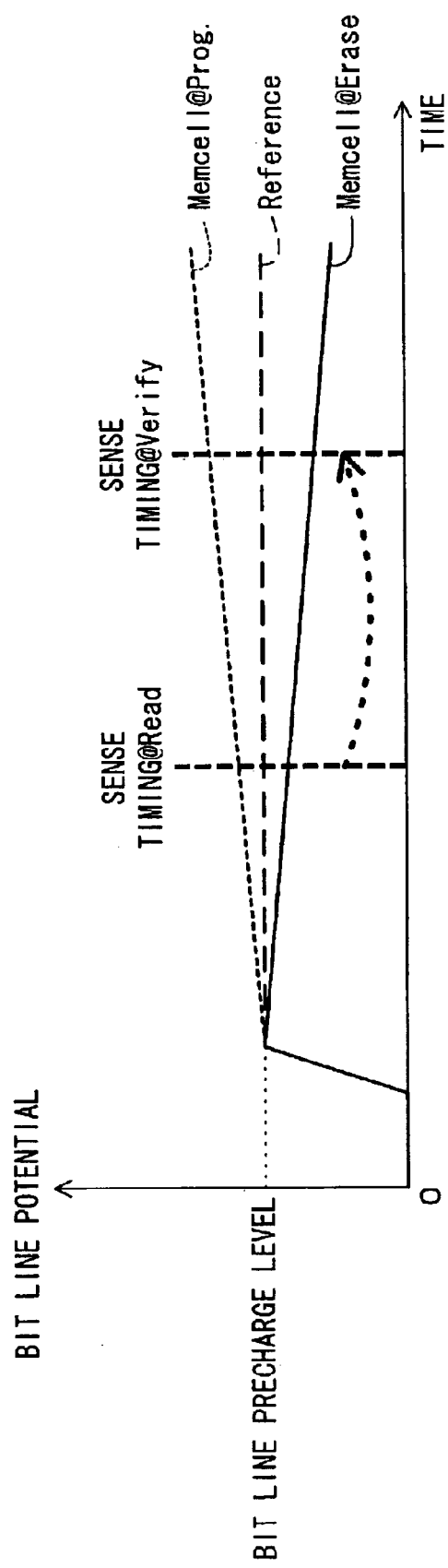
FIG. 5 is a diagram of the discharge waveform of complementary bit lines during dynamic sensing with the nonvolatile semiconductor memory device.

In this state, the selected word line TWL0 is set to H-level to select the memory cell Ma0 for data readout. At the same time, the selected word line BRWL0 is set to H-level to select the reference cell RCd0. As shown in FIG. 5, when the data readout operation is performed while an equal amount of current is supplied to the main bit line MBL0 and the anti-main bit line MBL1 from the bit line current supply circuit BLCASS, the potential Reference of the anti-main bit line MBL1, to which the reference cell RCd0 is connected, is maintained substantially at the precharge voltage because the current supplied from the bit line current supply circuit BLCASS is equal to the current used by the reference cell RDd0. In contrast, if the selected memory cell Ma0 is in the written state, then the potential of the main bit line MBL0, to which the memory cell Ma0 is connected, becomes the potential Memcell@Prog, which is higher than the precharge voltage, due to the amount of current that is supplied from the bit line current supply circuit BLCASS. On the other hand, if the selected memory cell Ma0 is in the erased state, then the potential of the main bit line MBL0 becomes the potential Memcell@Erase, which is lower than the precharge voltage, due to the current resulting from subtracting the current supplied from the bit line circuit supply circuit BLCASS from the cell current of the memory cell Ma0.

When the memory cell Ma0 and the reference cell RCd0 are thus selected to gradually increase the potential difference between the main bit line MBL0 and the anti-main bit line MBL1 and bring this difference to a level where it can be determined by the sense amplifier circuit SAMP, then at a predetermined point during Sense Timing@Read, the column gates Y0 and Y1 are set to the L-level to separate the sense amplifier circuit SAMP and the pair of main bit lines MBL0 and MBL1. The control signal SAE is set to the H-level and the control signal SAEN is set to the L-level to activate the sense amplifier circuit SAMP to compare the potentials of the main bit line MBL0 and anti-main bit line MBL1, amplify this difference, and perform data readout.

Figure 6A:
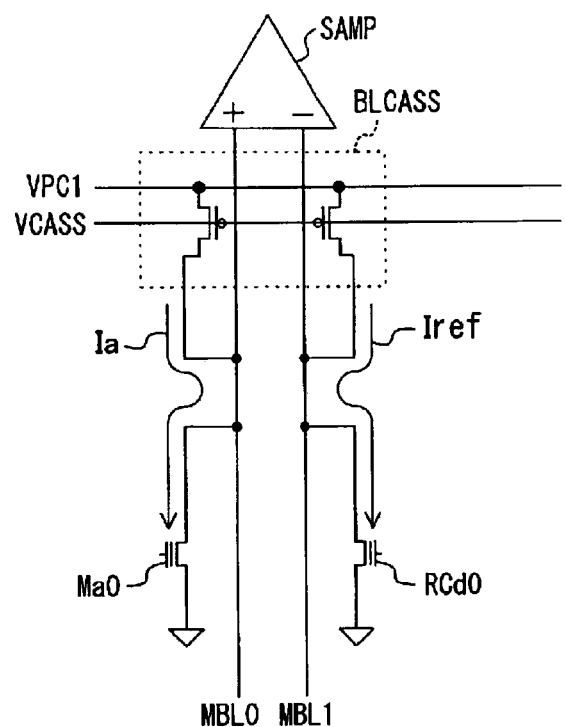
FIG. 6A is a diagram schematically showing the essential elements, including the bit line current supply circuit, that are provided in the nonvolatile semiconductor memory device.
Figure 6B:
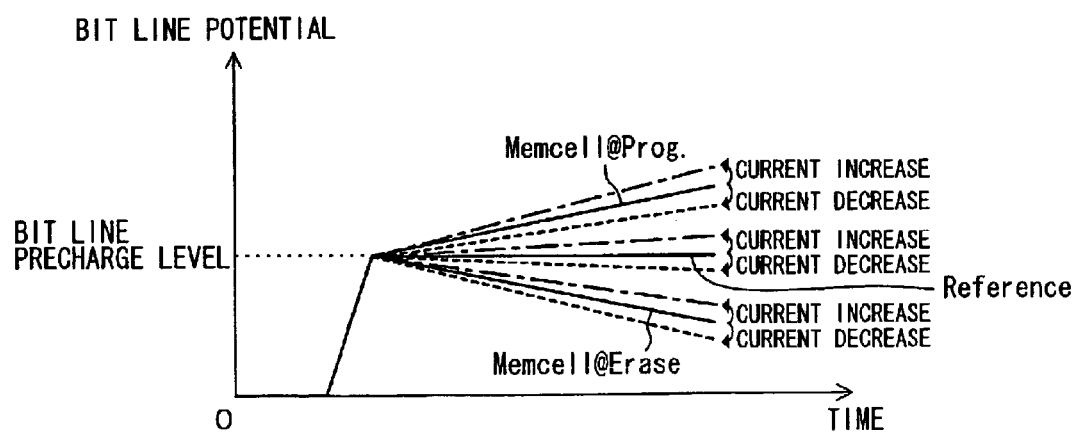
FIG. 6B is a diagram showing the discharge waveform of complementary bit lines in a case where the amount of current that is supplied from the bit line current supply circuit has varied.

Thus, as illustrated in FIG. 6A, if the readout operation is performed while identical current amounts of Ia and Iref are supplied to the main bit line MBL0 and the anti-main bit line MBL1, then the characteristics of the potential change in the main bit line MBL0 on the memory cell Ma0 side and the anti-main bit line MBL1 on the reference cell RCd0 side can be made identical. Moreover, as shown in FIG. 6B, the effects of changes in the amount of supplied current from the bit line current supply circuit BLCASS due to power source noise, for example, are equally reflected in the main bit line MBL0 and the anti-main bit line MBL1, and thus there is substantially no change in the potential difference between the main bit line MBL0 and the anti-main bit line MBL1 and there is substantially no impact on the differential readout operation. Accordingly, a data readout operation that is strong against noise is achieved. Also, because the activation timing of the sense amplifier circuit SAMP is equal at the written and erased states of the memory cells, it does have to be adjusted to a slower activation timing of the two, allowing a high-speed data readout operation to be achieved.

It should be noted that in this embodiment the reference cells RCa0, RCb0, RCc0, and RCd0 are each configured using a single memory cell, however, other configurations with which the above characteristics are attained can also be employed, such as configuring the reference cells using two memory cells in series or using MOS transistors to adjust the threshold voltage so that the cell current of the reference cells is a value in the middle between the memory cell current of the written state and the memory cell current of the erased state.

Second Embodiment

Next, a nonvolatile semiconductor memory device according to a second embodiment of the invention is described with reference to FIG. 7.

The configuration of the nonvolatile semiconductor memory device of this embodiment is identical to the configuration of the device according to the first embodiment shown in FIG. 3, and thus description thereof is omitted. The present embodiment is characterized in its data readout method and in that the amount of current that is flowed through the reference cell and the amount of current supplied to the main and the anti-main bit lines during readout are changed to correspond to the operation mode of the nonvolatile semiconductor memory device and to the readout precision.

Figure 7:
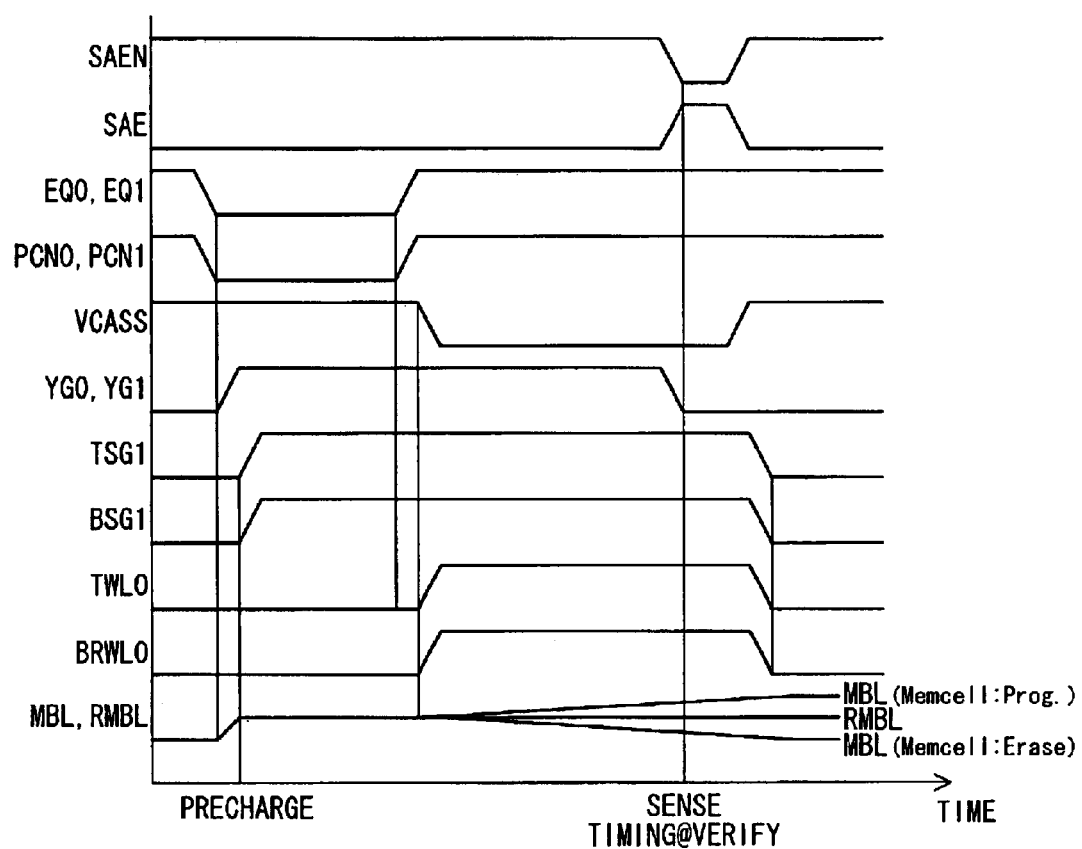
FIG. 7 is a diagram showing the operation timing of a nonvolatile semiconductor memory device according to the second embodiment of the invention.
Figure 8:
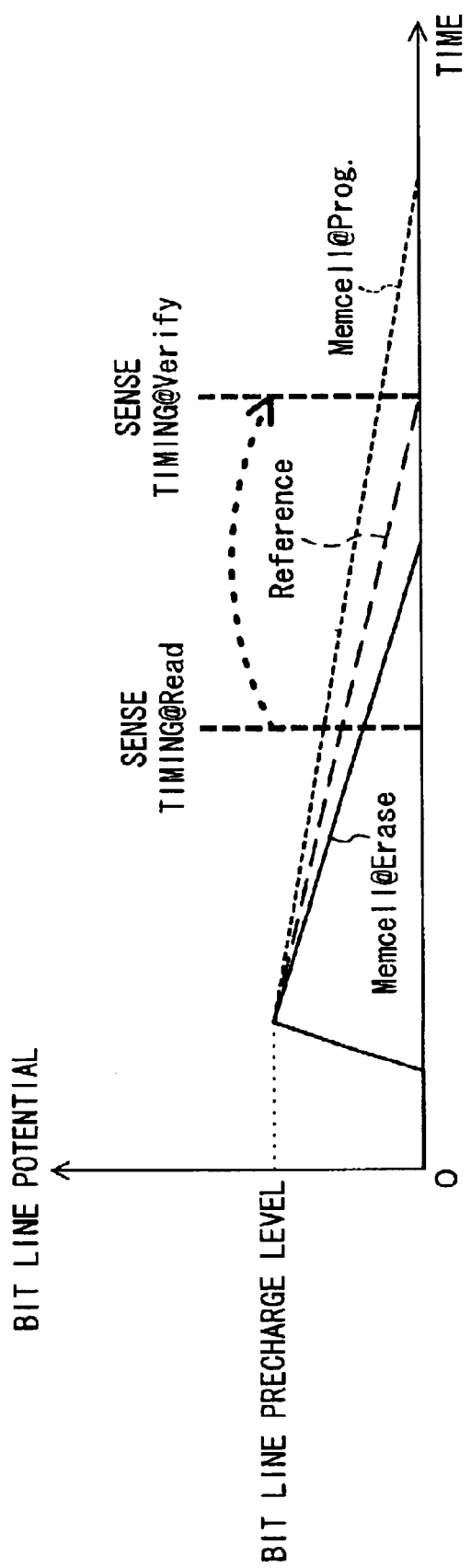
FIG. 8 is a diagram showing the discharge waveform of complementary bit lines according to conventional dynamic sensing.
Figure 9A:
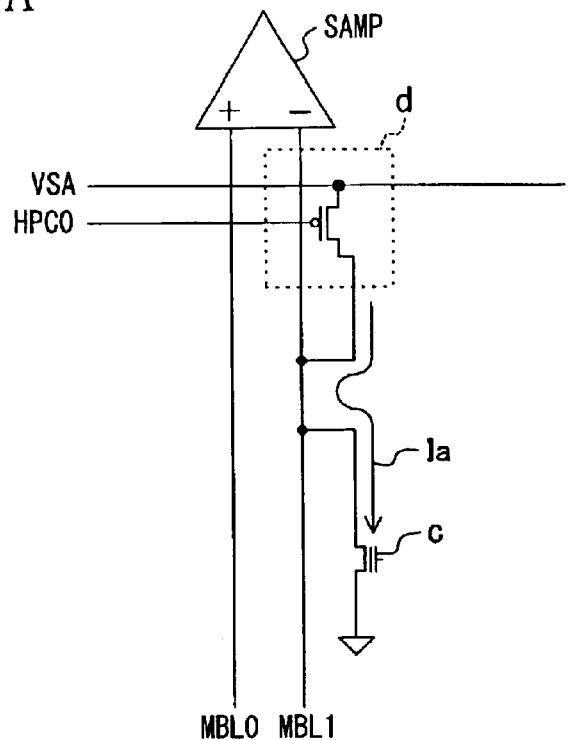
FIG. 9A is a diagram schematically showing the essential elements, including the ½ current supply circuit, of a conventional nonvolatile semiconductor memory device.
Figure 9B:
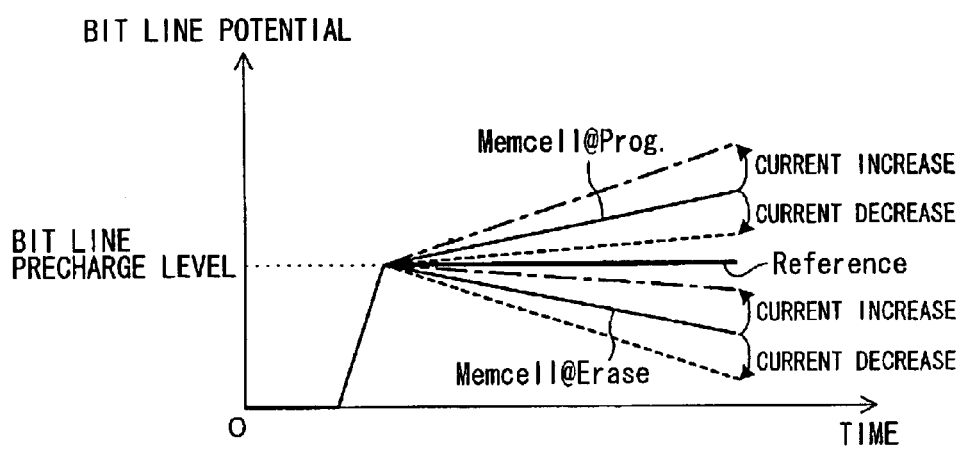
FIG. 9B is a diagram showing the discharge waveform of complementary bit lines in a case where the amount of current supplied from the ½ current supply circuit has varied.

FIG. 7 shows the data readout operation timing of this embodiment. As shown in the drawing, if a high-precision readout operation is performed, then operations during and after the sense amplifier circuit SAMP is activated are delayed compared to the data readout operation according to the first embodiment shown in FIG. 4.

More specifically, the readout operation is performed by delaying the timing at which the control signal SAE of the sense amplifier circuit SAMP is changed to H-level and the control signal SAEN is changed to L level, the timing at which the control signal VCASS of the bit line current supply circuit BLCASS is changed from L-level to H-level, and the timing at which the control signals YG0, YG1, TSG1, BSG1, TWL0, and BRWL0 are changed from H-level to L-level, to a timing at which a desired readout precision is obtained. Here, a desired readout precision refers to the precision at which the value that is expressed as the difference between the cell current of the memory cell and the cell current of the reference cell is determined, taking into consideration the operation margin of the sense amplifier circuit SAMP. If the operation margin of the sense amplifier circuit SAMP is constant, then the difference between the reference cell current and the memory cell current can be determined at a smaller value the more the activation timing of the sense amplifier circuit SAMP is delayed, and thus a high-precision readout operation becomes possible. The activation timing of the sense amplifier circuit SAMP is adjusted by the activation timing generation circuit 5 shown in FIG. 3.

A high-precision readout operation such as that mentioned above is particularly necessary for operation modes in which the cell current of the memory cell is determined by the sense amplifier circuit SAMP and in the verification operation for determining whether writing and erasure are being carried out as planned, for example. The verification operation is a crucial operation relating also to the reliability margin of the nonvolatile memory cell itself, and thus necessarily requires high-precision readout. As an example, the erase verification operation is described below. After data erasure, when the current that is flowed through the memory cell must be at least 50 $\mu$A under the same bias conditions as during the readout operation, then the voltage between the gate and the source of the reference memory cells RCa0 to RCd0 shown in FIG. 3 are adjusted so that the reference voltage that flows through these reference cells is 50 $\mu$A. It should be noted that although not shown, if reference cells are separately provided for erase verification and write verification, then it is not necessary to adjust the voltage between the gate and the source of the reference cells. Also, the voltage of the control signal VCASS of the bit line current supply circuit BLCASS can be adjusted so that a current equal to the reference cell current is supplied to the main bit line MBL0 and the anti-main bit line MBL1. The control signal VCASS of the bit line current supply circuit BLCASS is generated by the activation timing generation circuit 5 shown in FIG. 3, and the generation circuit 5 receives an operation mode signal of the nonvolatile semiconductor memory device and, based on this operation mode signal, adjusts the voltage of the control signal VCASS.

Also, in this state, the data readout operation is performed at Sense Timing@Verify shown in FIG. 7, which is a delayed point. This readout operation is substantially identical to the operation of the first embodiment, and thus is not described here. Then, the erase verification operation is performed by comparing the 50 μA reference current with the cell current of the memory cell itself after erasure.

Consequently, during the erase verification operation as well, performing the readout operation while supplying the same amount of current to the main bit line MBL0 and the anti-main bit line MBL1 allows the potential levels of the main bit line MBL0 and the anti-main bit line MBL1 to be effectively kept from dropping or flattening out, and thus data readout is performed at the readout timing Sense Timing@Verify, which is much slower than the normal readout timing Sense Timing@Read shown in FIG. 5, allowing a very precise readout operation to be achieved.

Furthermore, even if the amount of current supplied to the main bit line MBL0 and the anti main bit line MBL1 is changed due to power source noise, for example, the effects of the change in amount of current supplied to the main bit line MBL0 and the anti-main bit line MBL1 are similarly reflected in both bit lines, so that the differential readout operation is substantially not affected.

The above description was for the erase verification operation, although it is of course also possible to similarly adjust the current that is flowed through the reference cells and adjust the amount of current that is supplied to the main bit line MBL0 and the anti-main bit line MBL1 during the write verification operation and during the operation for measuring the memory cell current as well.

Thus, according to this embodiment, if the activation timing of the sense amplifier circuit SAMP is delayed to correspond to the desired operation mode, that is, to operation modes with different data readout precisions, then an accurate, high-precision data readout operation becomes possible.

It should be noted that in this embodiment, during the verification operation, the voltage of the control signal line VCASS of the bit line current supply circuit BLCASS is changed in order to adjust the amount of current that is supplied to the main bit line MBL0 and the anti-main bit line MBL1, but it is also possible to provide a plurality of bit line current supply circuits in which the supply current amount is preset in advance to correspond to the different operation modes, such as to the verification operation and to the operation for measuring the memory cell current.

Also, in the above description, the reference cells RCa0, RCb0, RCc0, and RCd0 are each configured using a single memory cell, however, other configurations are of course also possible, such as configuring the reference cells using two memory cells in series or using MOS transistors to allow the reference cell current to be adjusted to a desired value that corresponds to the operation mode.

Moreover, in the above description, memory cells for storing electrons in floating gates served as examples of nonvolatile semiconductor memory elements, however, this is not a limitation for the memory cells, and the present invention can be applied to all nonvolatile semiconductor memory elements for changing the current that is flowed through the memory cells to correspond to the state of the memory cells.

Additionally, the above description was made with regard to a nonvolatile semiconductor device, and more specifically the present invention can be used for various memory integrated circuits such as EEPROMs and Flash EEPROMs that are provided with a differential sense amplifier circuit, and can also be used in applications such as integrated circuit devices, including micro computers, that have been internally provided with such memory integrated circuits.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A nonvolatile semiconductor memory device comprising:
    a word line connected to control gates of memory cells in a row direction;
    a first bit line connected to drain sides of memory cells in a column direction;
    a reference word line connected to gates of reference cells in the row direction;
    a second bit line connected to a drain side of a reference cell;
    an amplifier for amplifying a potential difference between the first bit line and the second bit line;
    a precharge circuit for precharging the first and second bit lines to a predetermine potential at the start of data readout; and
    a bit line current supply circuit which substantially maintains the current amount supplied to the first and the second bit lines at a predetermined level during the data readout.

2. The nonvolatile semiconductor memory device according to claim 1, further comprising an activation timing generation circuit for adjusting an activation timing of the amplifier.

3. The nonvolatile semiconductor memory device according to claim 1, wherein a power source for supplying a power source voltage to the precharge circuit and the bit line current supply circuit is a stabilized power source that is arranged inside the nonvolatile semiconductor memory device, and
    the stabilized power source generates a power source voltage that is not dependant on an outside power source voltage.

4. The nonvolatile semiconductor memory device according to claim 3, wherein the bit line current supply circuit is controlled by a control signal line for controlling the current that is Supplied to the first bit line or the first rosin bit line and the current that is supplied to the second bit line or the second main bit line.

5. The nonvolatile semiconductor memory device according to claim 4, wherein the control signal line of the bit line current supply circuit is shielded by a power source line or a grand line of the stabilized power source.

6. The nonvolatile semiconductor memory device according to claim 1, wherein the bit line current supply circuit has a configuration with which the amount of supplied current is changed to correspond to an operation mode of the nonvolatile semiconductor memory device.

7. The nonvolatile semiconductor memory device according to claim 6, wherein the bit line current supply circuit supplies a current amount that is substantially equal to the amount of current that is flowed through one of the reference cells.

8. The nonvolatile semiconductor memory device according to claim 1, wherein the bit line current supply circuit is made of a plurality of bit line current supply circuits, each separately provided for an operation mode.

9. The nonvolatile semiconductor memory device according to claim 1, wherein an arrangement architecture of the first bit line and the second bit line is a folded bit line architecture in which the bit lines run parallel to one another, and the bit line current supply circuit is disposed at a location that is removed from the amplifier.

10. The nonvolatile semiconductor memory device according to claim 1, wherein an arrangement architecture of the first bit line and the second bit line is an open bit line architecture in which the bit lines are in line with one another, and the bit line current supply circuit is disposed at a location that is near the amplifier.

11. The nonvolatile semiconductor memory device according to claim 1, wherein the current amount supplied to the first bit line by the bit line current supply circuit and the current amount supplied to the second bit line by the bit line current supply circuit are the same.

12. A nonvolatile semiconductor memory device comprising:

a memory array comprising a plurality of memory cells and reference cells;

a plurality of word lines each connected to control gates of memory cells, from among the plurality of memory cells, in a row direction;

a plurality of sub-bit lines each connected to drain sides of memory cells, from among the plurality of memory cells, and a reference cell, from among the reference cells, in a column direction;

a first main bit line connected to one of the plurality of sub-bit lines;

a second main bit line connected to another one of the plurality of sub-bit lines;

an amplifier for amplifying a potential difference between the first main bit line and the second main bit line;

a precharge circuit for precharging the first and the second main bit lines to a predetermined potential at the start of data readout; and a bit line current supply circuit which substantially maintains the current amount supplied to the first and the second main bit lines at a predetermined level during the data readout.

13. The nonvolatile semiconductor memory device according to claim 12, wherein the reference cells are connected to reference cell word lines that are different from the word lines connected to the memory cells.

14. A data readout method of a nonvolatile semiconductor memory device having:

a word line connected to control gates of memory cells in a row direction;

a first bit line connected to drain sides of memory cells in a column direction;

a reference word line connected to gates of reference cells in the row direction;

a second bit line connected to a drain side of a reference cell;

an amplifier for amplifying a potential difference between the first bit line and the second bit line;

a precharge circuit for precharging the first and the second bit lines to a predetermined potential at the start of data readout; and a bit line current supply circuit which substantially maintains the current amount supplied to the first and the second bit lines at a predetermined level during the data readout;

the method comprising, when data is read out, the steps of;

selecting the memory cells by the word line to connect a memory cell of the plurality of memory cells to the first bit line;

selecting the reference cells by the reference word line to connect a reference cell of the plurality of reference cells to the second bit line; and maintaining the current amount supplied to the first bit line and the second bit line at a predetermined level.

15. The data readout method of a nonvolatile semiconductor memory device according to claim 14, wherein during data readout, first, the first and the second bit lines are precharged to the predetermined potential by the precharge circuit, and then during and a precharging, or only after precharging, a same current amount is supplied to the first and the second bit lines.

16. The data readout method of a nonvolatile semiconductor memory device according to claim 14, wherein the amount of supply current that is supplied to the first and the second bit lines during data readout is changed in correspondence with an operation mode of the nonvolatile semiconductor memory device during data readout.

17. The data readout method of a nonvolatile semiconductor memory device according to claim 14, wherein an activation timing of the amplifier during data readout is changed in correspondence with the data readout precision during the data readout.

* * * * *

UNITED STATES PATENT AND TRADEMARK OFFICE
CERTIFICATE OF CORRECTION

PATENT NO.     : 6,822,907 B2
DATED          : November 23, 2004
INVENTOR(S)    : Takafumi Maruyama et al.

It is certified that error appears in the above-identified patent and that said Letters Patent is hereby corrected as shown below:

Title page,
Item [56], References Cited, U.S. PATENT DOCUMENTS, after the listing of "6,480,410 B2", insert -- 6,532,174 B2 * 3/2003 Homma et al………..365/185.2 --.

Signed and Sealed this

Seventeenth Day of May, 2005

JON W. DUDAS
*Director of the United States Patent and Trademark Office*